(12) United States Patent
Allen

(10) Patent No.: US 6,828,574 B1
(45) Date of Patent: Dec. 7, 2004

(54) MODULATOR DRIVEN PHOTOCATHODE ELECTRON BEAM GENERATOR

(75) Inventor: Paul C. Allen, Beaverton, OR (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/634,258

(22) Filed: Aug. 8, 2000

(51) Int. Cl.[7] .......................... H01J 40/06; H01J 37/08; G21K 5/10
(52) U.S. Cl. .............................. 250/492.24; 250/492.22
(58) Field of Search .......................... 250/398, 397, 250/423 F, 492.24, 492.22, 492.1, 372, 492.21; 313/542; 340/953; 315/5; 372/20, 98, 99

(56) References Cited

U.S. PATENT DOCUMENTS

| | | | | |
|---|---|---|---|---|
| 2,668,778 A | * | 2/1954 | Taft et al. | |
| 4,196,257 A | * | 4/1980 | Engstrom et al. | 313/373 |
| 4,460,831 A | | 7/1984 | Oettinger et al. | |
| 4,618,217 A | * | 10/1986 | Armitage | 250/214 VT |
| 4,749,906 A | * | 6/1988 | Tran et al. | 250/214 VT |
| 4,763,996 A | * | 8/1988 | Hara et al. | 359/249 |
| 4,906,894 A | * | 3/1990 | Miyawaki et al. | 257/10 |
| 5,043,630 A | * | 8/1991 | Faillon et al. | 315/5 |
| 5,173,954 A | * | 12/1992 | Kato et al. | 359/242 |
| 5,208,696 A | * | 5/1993 | Kobayashi et al. | 359/238 |
| 5,395,738 A | * | 3/1995 | Brandes et al. | 250/492.24 |
| 5,539,568 A | | 7/1996 | Lin et al. | |
| 5,684,360 A | * | 11/1997 | Baum et al. | 313/530 |
| 5,691,541 A | | 11/1997 | Ceglio et al. | |
| 5,691,836 A | * | 11/1997 | Clark | 359/247 |
| 6,005,247 A | * | 12/1999 | Baum | 250/307 |
| 6,057,639 A | * | 5/2000 | May et al. | 313/371 |
| 6,282,213 B1 | * | 8/2001 | Gutin et al. | 372/20 |
| 6,376,985 B2 | * | 4/2002 | Lee et al. | 313/523 |
| 6,429,443 B1 | * | 8/2002 | Mankos et al. | 250/492.1 |
| 6,448,568 B1 | * | 9/2002 | Allen et al. | 250/492.24 |
| 6,498,349 B1 | * | 12/2002 | Thomas et al. | 250/398 |
| 6,544,698 B1 | * | 4/2003 | Fries | 430/22 |
| 6,724,002 B2 | * | 4/2004 | Mankos et al. | 250/492.24 |

FOREIGN PATENT DOCUMENTS

WO 01/09920 A1 2/2001

OTHER PUBLICATIONS

"Deformable–mirror spatial light modulators" authored by Hornbeck, Proc. SPIE–Int (1990), 1150, p. 86–102.*
Hornbeck,"Deformable–Mirror Spatial light Modulators" 1990, SPIE Critical Reviews Series, vol. 1150, p. 86–102.*

* cited by examiner

Primary Examiner—John R. Lee
Assistant Examiner—Kalimah Fernandez
(74) Attorney, Agent, or Firm—Jung-hua Kuo

(57) ABSTRACT

The present invention provides a source of multiple beams of electrons having a desired spatial pattern, as typically used for multiple beam lithography. A source of radiation, typically ultraviolet radiation, is directed onto a modulator and from the modulator onto a photocathode. The modulator, typically a spatial light modulator, imposes a spatial pattern onto the radiation. The pattern imposed onto the radiation is transmitted to the multiple beams of electrons as such beams are generated by the photocathode. An electron beam lithography system having higher throughput than conventional single beam systems is one result. Methods of creating multiple electron beams and methods of patterning targets with such multiple beams of electrons are also described. A micromirror array is a preferred modulator. Mercury arc lamp directing ultraviolet radiation by means of the modulator onto a cesium telluride photocathode is a preferred combination of radiation source and photocathode.

24 Claims, 2 Drawing Sheets

MODULATOR DRIVEN PHOTOCATHODE ELECTRON BEAM GENERATOR

BACKGROUND OF THE INVENTION

1. Technical Field

The present invention relates to electron beam lithography. In particular, the present invention relates to the creation and use of modulated electromagnetic radiation, typically ultraviolet radiation modulated by a spatial light modulator, impinging on a photocathode to form multiple beams of electrons, increasing thereby the throughput of electron beam lithographic systems.

2. Description of Related Art

Electron beam ("e-beam") lithography is a commercially important technique for patterning by directing a beam of electrons onto a substrate coated with a suitable resist. Development of the exposed resist followed by etching leads to the selective removal of material and creation of the desired pattern in regions exposed to electron impact (positive resists) or in regions not exposed to electron impact (negative resists). A common application of e-beam lithography is to manufacture the masks for use in photolithography, although direct e-beam exposure of an integrated circuit wafers and other targets is also performed.

Exposure of the resist is typically carried out by the direction of one or more focused beams of electrons onto the resist-coated substrate. Control of the electron optics (typically computer control) allows the process designer to direct the e-beam to the regions of the substrate requiring exposure, to compensate in beam deflection for mechanical translations of the stage containing the substrate, to scan or tile the substrate in the desired pattern, to control the dose of electrons impacting any particular pixel on the substrate (off, on or gray scales), and otherwise to direct the location and dose of e-beam impact to create the desired pattern. In addition to focused-beam lithography, projection e-beam lithography ("SCALPEL" and the like) are also being used. (See, for example, Yamashita et. al. Jpn. J. Appl. Phys. Vol 35 (1996) pp. 6404–6414 and Sohda et. al. J. Vac. Sci. Technol. B 13(6), November/December 1995 pp. 2419–2423). To be definite in our discussion, we will describe in particularity the patterning of a substrate by e-beam lithography using a plurality of focused electron beams. However, the present invention relating to the creation of multiple beams of electrons is not inherently limited to focused-beam lithography and generalizations to other areas of technical applicability will be apparent to those having ordinary skills in the art based upon the descriptions contained herein.

One significant drawback to lithography performed by means of a focused beam of electrons is the relatively low throughput obtainable in comparison with photolithography performed by exposure through a mask. It may require several hours (perhaps as many as 30 hours) to fully expose a substrate to e-beam impact. The e-beam equipment must function properly and continuously throughout this process. Equipment failures during exposure lead to rejection of products, a reduction in average throughput and further increases in overall costs. Thus, various means have been proposed for accelerating e-beam lithography, one of which relates to the use of multiple focused beams of electrons directed in parallel onto the substrate. See, for example, Groves et. al. (U.S. Pat. No. 5,981,962); Lin et. al. (U.S. Pat. No. 5,539,568), Mueller et al.(U.S. Pat. No. 4,856,037) and references cited therein. A recent review of electron projection display technology is given by Hornbeck in TI Technical Journal, July–September 1998, pp. 7–46.

The present invention generally relates to sources and means for creating multiple beams of electrons by directing suitably modulated light onto a suitable photocathode. Other sources of multiple parallel beams of electrons are described, for example, in the work of Schneider and co-workers (J. Vac. Sci. Technol. B 14(6), NovemberDecember 1996 pp. 3782–3786 and J. Vac. Sci. Technol. B 15(6), NovemberDecember 1997 pp. 2702–2712), Baum (U.S. Pat. No. 6,005,247), MacDonald (U.S. Pat. No. 5,363,021) and Engle (U.S. Pat. No. 5,557,177) and references cited therein.

The present invention also generally relates to the use of spatially modulated patterns of light impinging on a photocathode to create multiple sources of electrons at the photocathode. The multiple e-beams thus created impinge on the acceptance cone of a suitable focusing column(s), creating thereby multiple beams of focused electrons for lithography. Techniques and equipment for modulating light include the work of Hara et. al. (U.S. Pat. Nos. 4,741,602; 4,763,996; 4,818,983), Kobayashi et. al. (U.S. Pat. Nos. 5,170,281; 5,208,696), Kato et. al. (U.S. Pat. No. 5,173,954) and Sandström (PCT International Publication No. WO 99/45441) and references cited therein. Other examples of modulated and/or patterned light include the work of Sweatt (U.S. Pat. No. 5,920,380) and Culkin (U.S. Pat. No. 5,543,862) and references cited therein.

BRIEF SUMMARY OF THE INVENTION

The present invention relates to the creation and use of modulated electromagnetic radiation, typically ultraviolet radiation modulated by a spatial light modulator, impinging on a photocathode to form multiple beams of electrons, increasing thereby the throughput of electron beam lithographic systems.

Electron beam exposure of a resist for patterning is typically carried out by the direction of one or more focused beams of electrons onto the resist-coated substrate. Control of the electron optics (typically computer control) allows the process designer to direct the e-beam to the regions of the substrate requiring exposure, to compensate in beam deflection for mechanical translations of the stage containing the substrate, to scan or tile the substrate in the desired pattern, to control the dose of electrons impacting any particular pixel on the substrate (off, on or gray scales), and otherwise to direct the location and dose of e-beam impact to create the desired pattern. A drawback to lithography performed by means of a focused beam of electrons is the relatively low throughput obtainable in comparison with photolithography performed by exposure through a mask. Thus, various means have been proposed for accelerating e-beam lithography, one of which relates to the use of multiple focused beams of electrons directed in parallel onto the substrate.

The present invention generally relates to sources and means for creating multiple beams of electrons by directing suitably modulated light onto a suitable photocathode. The present invention also generally relates to the use of spatially modulated patterns of light impinging on a photocathode to create multiple sources of electrons at the photocathode. The multiple e-beams thus created impinge on the acceptance cone of a suitable focusing column(s), creating thereby multiple beams of focused electrons for lithography. The present invention provides a source of multiple beams of electrons having a desired spatial pattern, as typically used for multiple beam lithography. A source of radiation, typically ultraviolet radiation, is directed onto a modulator and from the modulator onto a photocathode. The modulator, typically a spatial light modulator, imposes a spatial pattern onto the radiation. The pattern imposed onto the radiation is transmitted to the multiple beams of electrons as such beams are generated by the photocathode. An electron beam lithography system having higher throughput than conventional single beam systems is one result. Methods of creating multiple electron beams and methods of patterning targets with such multiple beams of electrons are also described. A micromirror array is a preferred modulator. Mercury arc lamp directing ultraviolet radiation by means of the modulator onto a cesium telluride photocathode is a preferred combination of radiation source and photocathode.

BRIEF DESCRIPTION OF THE DRAWINGS

The drawings herein are schematic only and not drawn to scale.

DETAILED DESCRIPTION OF THE INVENTION

Figure 1:
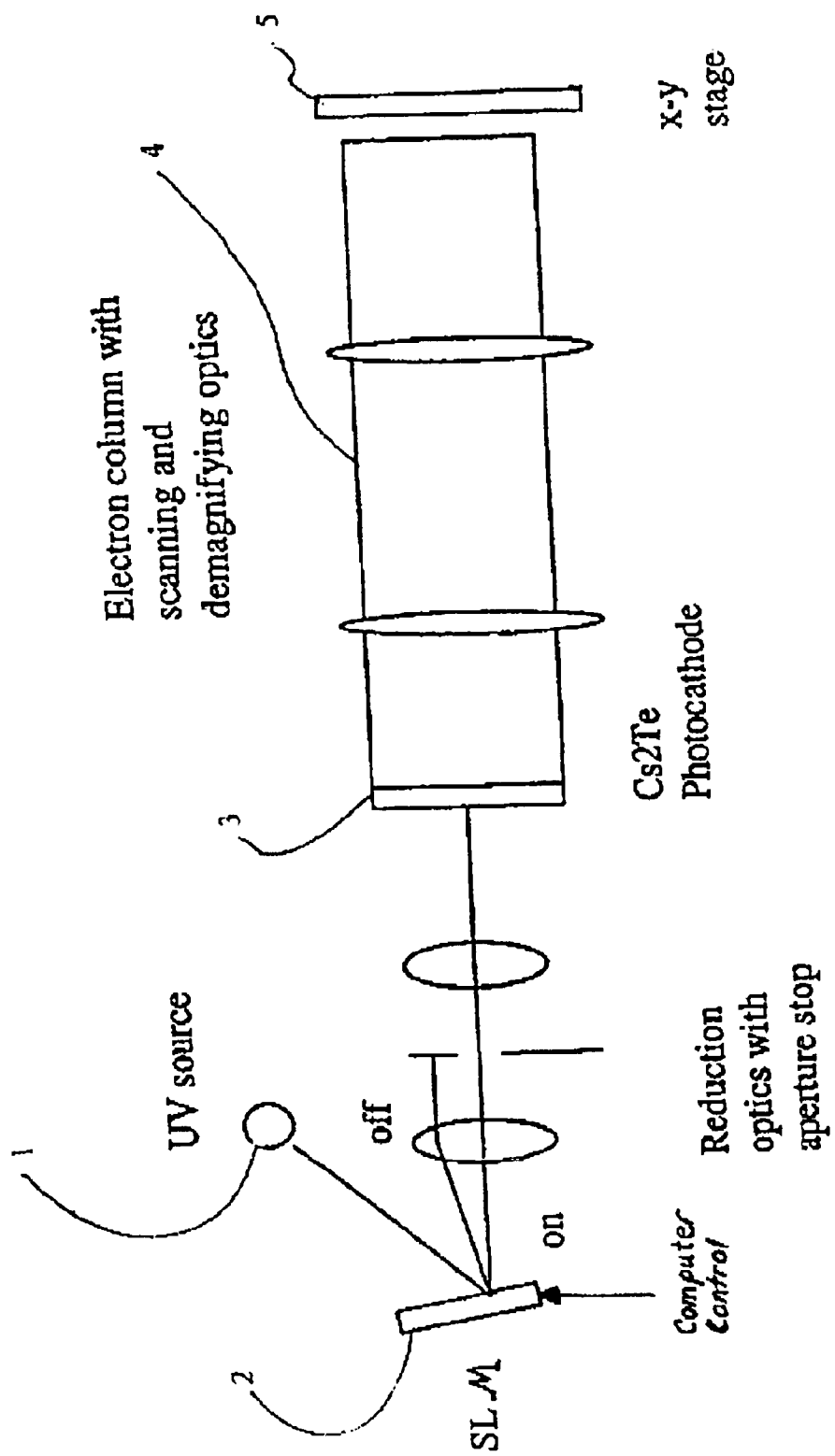
FIG. 1: Schematic depiction of spatial light modulator generating multiple electron beams by directing modulated light onto a photocathode.

In the following description and figures, similar reference numbers are used to identify similar elements.

Electron beam lithography is one technique used to write precise patterns on a layer of photoresist. Development and etching following exposure to a focused beam of electrons leads to the desired pattern being created in the layer(s) of material underlying the layer of photoresist. Positive photoresists lead to etching in those regions exposed, while negative photoresists lead to etching in those regions not exposed. Both positive and negative photoresists are useful in commercial applications.

Electron beam lithography, making use of a highly focused electron beam ("e-beam") is capable of producing very fine patterns in the layer of photoresist, limited by e-beam defocusing resulting from electron-electron repulsion and other effects of electron optics, dynamics, etc. Computer control of the electron beam as to direction and intensity results in the ability to produce a large variety of patterns in the target substrate. However, an important limitation in the applicability of e-beam lithography is the relatively low throughput that can be obtained. As the patterns desired in the photoresist become ever smaller, more pixels of smaller dimension must be written. Directing the e-beam to the appropriate pixel and exposing the pixel with the proper dose of electrons becomes a time-consuming process. Thus, e-beam lithography finds one of its most important commercial applications in writing photolithography masks. Precise computer control of e-beam patterning allows the mask designer to create, in principle, substantially any configuration of patterns (circuit elements) that may be desired on the substrate. The mask thus written will typically be used photolithographically to expose many targets (typically integrated circuit wafers), so the time-consuming process of creating the mask is amortized over many exposed integrated circuits, making e-beam mask creation economically and commercially feasible.

Electron beam patterning may be carried out in a variety of ways. Raster scan denotes the e-beam process of scanning the electron beam across the entire surface of the target to be exposed pixel-by-pixel, while adjusting the e-beam intensity to provide the proper dose to each pixel. Raster scanning is the typical scanning mode used in CRTs or TV receivers, directing the electron beam in the same row-by-row (or column-by-column) pattern no matter what screen image is to be created. The requirements to create a particular image determine the intensity to be delivered to each pixel but not the pattern by which the beam is scanned. The simplest raster scanning e-beam systems use simple on-off beam control while other systems provide several levels intermediate exposure ("gray" levels) between full-on and full-off. Some raster scanning procedures construct gray scales from on-off beams by using pulse width modulation ("PWM"). That is, the pixel period is subdivided into shorter intervals and the beam is turned on for a fraction of the pixel period. (In some cases a retrograde scan is introduced to hold the beam stationary on the substrate during each pixel exposure.) Other scanning procedures use multi-pass printing techniques in which partial (gray scale) exposure is achieved by multiple raster scans with full exposure for some of the scans and zero exposure for other scans, thereby achieving partial exposure of the pixel. Raster scan has the advantage of a simple and predictable scanning pattern, not varying for the writing of different patterns. This simplicity of scanning pattern allows the scanning process to be optimized for maximum scanning speed (and throughput).

In addition to raster scanning, some e-beam lithography processes make use of vector scanning. Vector scanning directs the e-beam to a region of target surface to be scanned and then "tiles" a contiguous (or near-contiguous) region with e-beam energy before moving to another surface region to expose. Vector scanning may reduce the motion of the e-beam across the surface to be patterned, but at the cost of increased complexity in scanning and writing. Electron intensity directed to a relatively localized area, as in vector scanning, may exacerbate other effects such as substrate heating, further complicating the writing process.

In addition to vector and raster scanning, the surface, or a portion thereof, may be exposed in parallel by a wide flash of electrons as projection e-beam lithography, typically through a mask. "SCALPEL" is one embodiment of the exposure of an extended area by a single flash of electrons known in the art.

One way to increase the throughput of raster scanning without introducing the complications of vector scanning is to perform raster scanning with multiple e-beams. That is, one of many substantially parallel electron beams is directed to every pixel on the entire surface of the wafer, delivering the appropriate intensity (perhaps zero) to each pixel towards which that particular e-beam is directed. Multiple e-beam raster scanning thus provides an improvement in throughput in comparison with beam raster scanning. If N beams are used in place of 1 beam, the increase in throughput is typically less than a factor of N since other processes involved in the manipulation and control of N beams retard the writing process. In general, however, the increase in throughput is significant.

The present invention describes in detail the example of multiple e-beam raster scanning in order to be definite in our descriptions. Although raster scanned e-beam lithography is expected to be the primary field of use of the present invention, the techniques disclosed herein, and their equivalents, may be generalized in a straight-forward manner to apply to other forms of e-beam patterning without undue experimentation and are intended to be included within the scope of the present invention.

FIG. 1 depicts one embodiment of the present invention. A source of electromagnetic radiation, 1, illuminates a spatial light modulator ("SLM"), 2. It is anticipated that uv radiation will be the preferred form of electromagnetic radiation, 1, for purposes of creating multiple electron beams. However, the present invention is not inherently so limited and other wavelengths and light sources may be employed, including focused or defocused laser beams, frequency doubled (or multiplied) laser sources, and the like. The primary purpose of the radiation source in the current invention is to create emitted electrons when such radiation impinges upon a photocathode, 3. The radiation source, 1, thus is to be compatible with the electron emission characteristics of the photocathode, emitting electrons with reasonable efficiency, with a reasonable spread in the spatial and energy distribution of the emitted electrons, and a reasonable combination of cost, reliability, longevity, ease and convenience of use for both the radiation source and the photocathode.

While uv is the presently preferred radiation source, other wavelengths are not excluded from the scope of the present invention when used in combination with the appropriate photocathode material for achieving an acceptable emission of electrons. The light source is preferably spatially uniform, lacking significant variations in the intensity, wavelength and/or other properties of the radiation over the region thereof impinging on the SLM, 2, and used in creating photoelectrons. Thus, it is desirable that the radiation from source, 1, be reasonably constant and result in stable generation of electron beams. However, non-uniform radiation sources are not inherently excluded from the scope of the present invention. Spatial and/or wavelength variations in radiation 1 may in some cases be compensated by appropriate use of the SLM, 2 or by rejection of the electrons lacking the proper properties by means of the electron beam optics, 4. Lasers, mercury arc lamps and the like are adequate sources of electromagnetic radiation for the practice of the present invention. The mercury arc lamp is a convenient light source for use with a cesium telluride photocathode, typically making use of radiation of wavelength around 250 nm (nanometers). Alternatively, solid state lasers emitting 266 nm radiation, frequency doubled argon ion lasers producing 257 nm radiation are also acceptable choices. The argon ion laser line at 364 nm may also be acceptable for illuminating a cesium telluride photocathode if the quantum efficiency yields sufficient intensity of electrons for use in multiple beam lithography.

By "spatial light modulator," we intend any device that modulates the intensity (or other property or properties) of the radiation emanating from source, 1, resulting in multiple beams of electrons being emitted from photocathode, 3. Several types of SLMs are acceptable in the practice of the present invention.

The radiation from source, 1, is typically directed to a spatial light modulator, SLM, 2. The function of the SLM is to define a pattern of radiation that is directed onto the photocathode, 3, for the creation of multiple beams of electrons. It is preferred that the SLM be capable of altering its light-modulating characteristics in response to computer control such that the computer controls the pattern of electron beams emitted by the photocathode by controlling the SLM. One convenient choice for SLM is the micromirror array, such as that manufactured by Texas Instruments, Inc.

The SLM depicted in FIG. 1 is shown modulating the radiation from source 1 by means of reflection. Transmissive SLMs are known in the art and may also be employed in the practice of the present invention. Further, it is not an inherent limitation of the present invention that the electromagnetic radiation impinging on photocathode, 3, be modulated spatially in intensity. Spatial variations in any property of the electromagnetic radiation (wavelength, phase, etc.) that result in different electron emissions when impacting the photocathode, 3, may be employed in the practice of the present invention. However, spatial variations in intensity, such as produced by a micromirror array or several other types of SLM, is the presently preferred embodiment of the present invention.

The pattern of light generated by means of SLM, 2, is directed onto photocathode, 3. This recreates (or "images") on the photocathode the pattern of the SLMs reflective properties as depicted in FIG. 1 (or transmissive properties for transmission SLMs). Electrons are thus emitted from the photocathode in a pattern determined by the reflective (or transmissive) properties of the SLM. Extracting the pattern of electrons thus generated from photocathode, 3, into the e-beam scanning and focusing column, 4, creates a multiple beam pattern whose cross-sectional pattern at the plane of the target, 5, is determined by the pattern of the SLM.

The micromirror array used as an SLM typically functions by tilting individual mirror elements in response to electrical command signals to deflect the radiation incident thereon in a number of different directions. A simple two-direction mirror deflection, on-off as depicted in FIG. 1, may be employed in the practice of the present invention More complex patterns of deflections from micromirror arrays may be used in conjunction with the present invention. Diffractive devices typically create pixel-by-pixel gratings within the SLM by deforming a small region of a surface or, alternatively, may create a phase grating pixel-by-pixel. Either of these two broad class of SLM devices are useful in the practice of the present invention.

In addition to SLMs consisting of micromirror arrays, many other types of SLMs may be used in the practice of the present invention. Liquid crystal displays ("LCDs") may be used in either transmission or reflection mode as an SLM with the present invention. LCDs tend to have slower response times than other candidate SLMs for use in the present invention, but may have appropriate compensations in terms of cost, power consumption, etc. However, the use of SLMs typically provides such a high degree of parallelism that slower response times may be accepted without serious degradation in the performance of the overall system. Other candidate SLMs include the "grating light valves" made by Silicon Light Machines of Sunnyvale, Calif. The grating light valve typically functions by displacing alternate strips of a suitable substance (silicon nitride, for example) to make a miniature phase grating pixel-by-pixel across the grating light valve. It is thus feasible to diffract light off of each element of the light valve at will Grating light valves typically have faster response times than many commercially available SLMs and are among those SLMs that may be used in the practice of the present invention.

One consideration in the choice of the SLM to be used in the present invention is the ability (or lack thereof) to produce varying levels of light (gray scales) between full-on and full-off and to direct these intermediate light levels onto the photocathode. The micromirror arrays typically deflect the radiation incident thereon to the photocathode, or elsewhere, thus creating an on-off device lacking gray scales. However, by the use of pulse width modulation, micromirror devices can be used to produce effective gray scales. Pulse width modulation ("PWM") denotes the technique of dividing up each spatial pixel of the photocathode requiring exposure into several distinct segments in the time domain, and exposing the spatial photocathode pixel for some, all, or none of the time domain segments. For example, full exposure of a spatial photocathode pixel may be divided into N separate time segments. Exposing the spatial pixel for 0, 1, 2, . . . N time segments permits (N+1) exposure levels to be used. Pulse width modulation requires that the response time of the SLM (for example, the deflection time of the mirror) be sufficiently rapid that exposure of the spatial pixel can be carried out by a sequence of smaller pulses, each smaller pulse individually being either full-on or full-off, resulting in gray scales determined by the number of smaller pulses used to expose the spatial pixel.

Some grating light valves have the capability of altering the extent to which the deformation is induced, thereby altering in an analogue manner the light diffracting properties of the light valve. Thus, numerous gray scales are possible with such light valves.

Conventional applications of SLMs typically relate to projecting images with light, in essence, creating a visible image from electronic inputs (or other optical inputs). Display devices are thus the common application of SLMs. The present invention uses the SLM as imaged onto the photocathode to create multiple electron beams, the characteristics of which are determined by the characteristics of the light derived from or through the SLM. In essence, the "image" of the SLM is projected onto the photocathode to create a corresponding pattern of emitted electrons. This pattern of emitted electrons is reduced in spatial extent by means of the column, 4, to a dimension typically smaller than that which can be achieved with light. Thus, the present invention combines the optical advantages of SLMs (including high parallelism and improved throughput) with the advantages of e-beam optics and lithographic systems (including the ability to write very small patterns).

Typically, the photocathode is located at the top of the electron beam column, operating in transmission as depicted in FIG. 1. That is, light impinging on one face of the photocathode causes the emission of electrons from the opposite face. However, reflective photocathodes may also be used in which light impinging on the photocathode causes emission of electrons from the same face. The photocathode may be mounted on a substrate transparent to the incident electromagnetic radiation. This transparent substrate may itself be the window separating the vacuum of the electron beam column from the outside environment, or there may be another transparent window (separate from the photocathode mount). Other configurations for mounting the photocathode so as to receive the radiation incident from the SLM and deliver electrons into the e-beam column are feasible as would be apparent to those having ordinary skill in the art.

Several design considerations are typically taken into account in selecting a photocathode material and mounting configuration. For example, a photocathode material having a high efficiency (quantum yield) is desirable in order to produce an adequate number of electrons in response to photon impact. However, some materials, such as negative electron affinity photocathodes, (cesiated gallium arsenide, for example) produce reasonably efficient photocathodes but are very sensitive to atmospheric contamination. Thus, their use in a production environment is problematic. Longevity and durability of the photocathode material are significant problems in the successful commercial application of photocathode-generated electron beams, and are major considerations in choice of photocathode material.

Another candidate photocathode material is gold. Gold is adequately stable in a production environment and can be transported in air. But gold has a rather low photoyield (electrons per photon). Also, gold has a relatively high work function. Thus, uv radiation must be used to illuminate a gold photocathode in order to supply photons with energies exceeding the work function and capable of emitting electrons.

Photocathodes with low quantum yields can also be used in the practice of the present invention if illuminated with sufficient light to give adequate emission of electrons. However, intense radiation impinging on the photocathode may cause excessive heating, and other damage to the photocathode material.

In consideration of the above factors, cesium telluride ($Cs_2Te$ as indicated in FIG. 1) seems to offer a favorable balance of high quantum yield, stability and ease of use in a production environment. The use of an SLM interposed between the radiation source and photocathode acts to spread the radiation over the photocathode, reducing the intensity impinging (or electrons emitted) from any localized region of the photocathode. This spatial dispersion tends to reduce the potential damage to the photocathode material, tending thereby to increase its useful service life.

Another consideration affecting the choice of photocathode material is that the work function for ejecting electrons from the photocathode should not be too much smaller than the energy of the photons directed upon the photocathode. The energy of the incident photons in excess of the minimum needed to emit an electron typically appears as kinetic energy of the emitted electron. Thus, the electrons leave the photocathode with a velocity directed both perpendicular and parallel to the surface of the photocathode. The parallel component of electron velocity gives the emitted electrons an angular spread as they approach the beam-forming electron optics. Those electrons outside the acceptance angle of the beam-forming optics are lost and decrease the beam current delivered to the target, 5. Thus, e-beam currents will tend to decrease as photon energies increase causing more electrons to be outside the acceptance angle of the beam-forming optics. On the other hand, higher intensity light impinging on the photocathode increases the number of emitted electrons without affecting the distribution of velocities. Thus, intense light with photon energies modestly exceeding the work function of the photocathode are preferred For reasons of achieving higher beam current, negative electron affinity photocathodes offer advantages (but are difficult materials to handle). Negative electron affinity materials have a very low work function, resulting in almost all the electrons emitted being collected by the beam-forming optics. However, such materials typically need to be kept in high vacuum (typically $10^{-9}$–$10^{-11}$ torr). The cesium component of many negative electron affinity photocathodes needs to be replenished from time to time ("recesiated"). Cesium telluride offers a favorable balance of reasonable work function with ease of handling. Although negative electron affinity photocathodes offer the advantages of high quantum yield (high efficiency) and the ability to be illuminated with longer wavelengths, the difficulties of handling the material are significant. The need for recesiation and sensitivity to poor vacuum conditions are among the chief disadvantages of negative electron affinity photocathodes.

Figure 2:
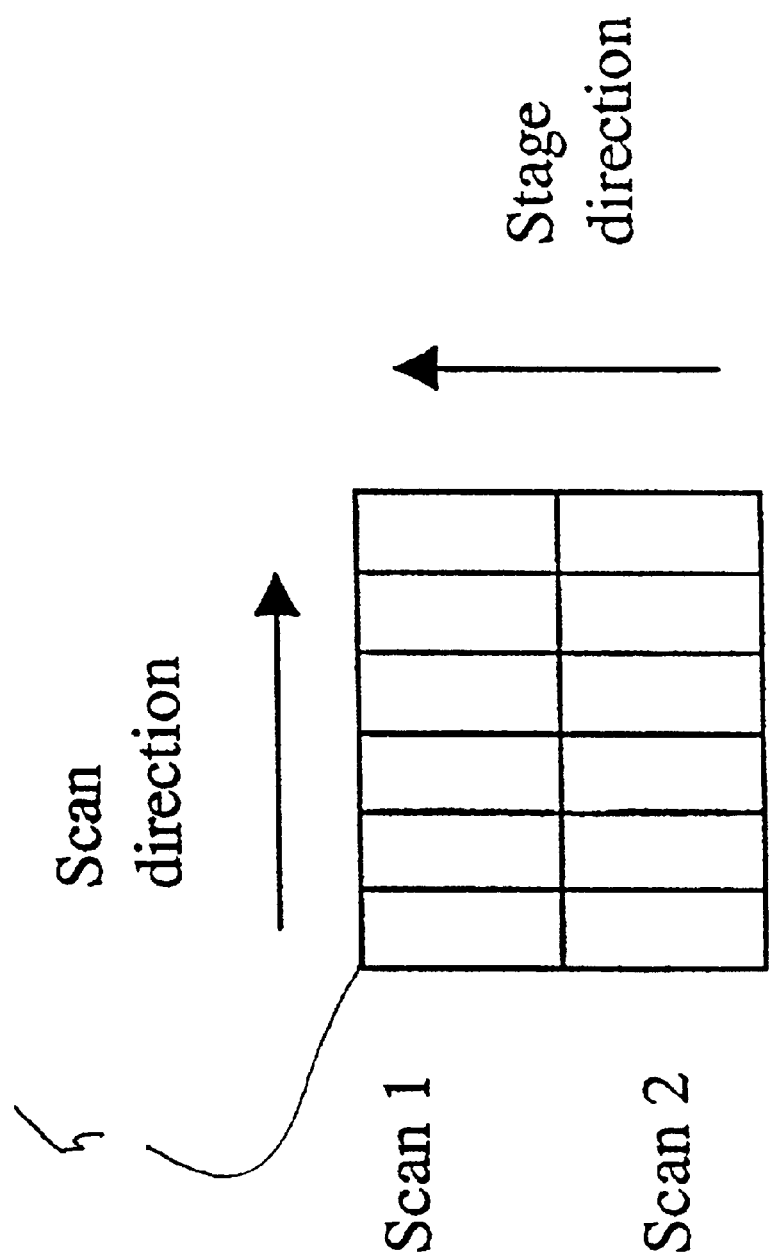
FIG. 2: Schematic depiction of stage motion and multiple scans as viewed from the direction of the impinging electron beam.

FIG. 2 depicts schematically and not to scale the e-beam target ("stage"), 5, from above, the direction from which the e-beam impinges upon the target. The stage typically undergoes continuous mechanical motion as depicted in FIG. 2 as "stage direction." The e-beam is typically deflected to track the mechanical stage motion continuously and synchronously so the e-beam pattern sees essentially a stationary stage upon which to write. The location of the stage is typically monitored by laser interferometry, resulting in very high accuracy in stage position information. E-beam deflections are superimposed on this compensatory deflection to write the pattern. Both x,y deflections for pattern writing typically occur.

One way to increase the accuracy in pattern writing is to write the same general field several times, but with slightly offset writing fields from one writing to the next. This offset multi-pass writing strategy helps reduce errors at the region where fields adjoin. Averaging the e-beam writing over several fields having different boundaries typically reduces the errors occurring at the junction of boundaries. Additionally, multi-pass offset writing may be used to construct intermediate levels of beam exposure; that is increased number of gray scales. A given pixel may occur in several distinct writing passes and, by exposing different amounts in different passes, achieve multiple levels of exposure that could not be achieved with a single pass writing of the pixel.

Writing with a number ("N") of distinct e-beams in parallel may ideally increase the throughput of e-beam lithography by a factor of N over a singe beam system. However, this increase is not typically achieved in practice since the switching speeds of N-beam generating devices (that is, the SLM in the present invention) are typically slower than those of a single e-beam with a beam blanker. Since N may be potentially in the millions, some sacrifice in switching speed is acceptable. For example, it is estimated that a square region 125 mm on a side could be written with a multi-beam system in approximately 40 minutes (plus some system overhead), which is much faster than a single beam system. Single beam systems may take 3–30 hours to write a similar region. Writing a grid of 50 nm pixels over an area of 125 mm$^2$ using a 300 MHz system (switching speed) and ignoring system overhead is estimated to take about 6 hours.

Having described the invention in detail, those skilled in the art will appreciate that, given the present disclosure, modifications may be made to the invention without departing from the spirit of the inventive concept described herein. Therefore, it is not intended that the scope of the invention be limited to the specific and preferred embodiments illustrated and described.

I claim:

1. A device for generating a plurality of electron beams comprising:
   a) a source of radiation;
   b) a spatial light modulator having a position so as to modulate said radiation emanating from said source of radiation and being configured to alter radiation modulation characteristics thereof in response to computer control; and
   c) a photocathode having a position so as to receive said modulated radiation wherein said photocathode simultaneously produces a plurality of electron beams under impact by said modulated radiation as result of said modulation of the radiation by the spatial light modulator, said modulation of the radiation by the spatial light modulator results in the radiation being simultaneously directed in multiple directions to control the pattern and directions of the electron beams emitted by the photocathode.

2. A device as in claim 1 wherein said radiation is uv radiation.

3. A device as in claim 2 wherein said source of radiation is a mercury arc lamp.

4. A device as in claim 3 wherein said photocathode is cesium telluride.

5. An device as in claim 1 wherein said spatial light modulator is a micromirror array.

6. A device as in claim 1 wherein said spatial light modulator is configured to simultaneously modulate the radiation in a direction corresponding to each electron beam produced by the photocathode.

7. An electron beam lithography system comprising:
   a) a source of radiation;
   b) a spatial light modulator having a position so as to modulate said radiation emanating from said source of radiation and being configured to alter radiation modulation characteristics thereof in response to computer control;
   c) a photocathode having a position so as to receive said modulated radiation wherein said photocathode simultaneously produces a plurality of electron beams under impact by said modulated radiation as result of said modulation of the radiation by the spatial light modulator and said modulation of the radiation by the spatial light modulator results in the radiation being simultaneously directed in multiple directions to control the pattern and directions of the electron beams emitted by the photocathode; and
   d) an electron beam optical column having a position so as to receive said plurality of electron beams and to direct said plurality of electron beams onto a target.

8. A system as in claim 7 wherein said radiation is uv radiation.

9. A system as in claim 8 wherein said source of radiation is a mercury arc lamp.

10. A system as in claim 9 wherein said photocathode is cesium telluride.

11. A system as in claim 7 wherein said spatial light modulator is a micromirror array.

12. A system as in claim 7 wherein said spatial light modulator is configured to simultaneously modulate the radiation in a direction corresponding to each electron beam produced by the photocathode.

13. A method of producing a plurality of electron beams comprising:
   a) directing radiation onto a spatial light modulator, thereby modulating said radiation, the spatial light modulator being configured to alter radiation modulation characteristics thereof in response to computer control; and
   b) directing said modulated radiation onto a photocathode thereby simultaneously producing a plurality of electron beams as result of said modulation of the radiation by the spatial light modulator, said computer-controlled modulation of the radiation by the spatial light modulator controls the pattern and directions of the electron beams emitted by the photocathode by simultaneously directing the radiation in multiple directions.

14. A method as in claim 13 wherein said radiation is uv radiation.

15. A method as in claim 14 wherein said radiation is generated by a mercury arc lamp.

16. A method as in claim 15 wherein said photocathode is cesium telluride.

17. A method as in claim 13 wherein said spatial light modulator is a micromirror array.

18. A method as in claim 13 wherein said spatial light modulator is configured to simultaneously modulate the radiation in a direction corresponding to each electron beam produced by the photocathode.

19. A method of performing lithography with multiple breams of electrons comprising:
   a) directing radiation onto a spatial light modulator, thereby modulating said radiation, the spatial light modulator being configured to alter radiation modulation characteristics thereof in response to computer control;
   b) directing said modulated radiation onto a photocathode thereby simultaneously producing a plurality of electron beams as result of said modulation of the radiation by the spatial light modulator, said computer-controlled modulation of the radiation by the spatial light modulator controls the pattern and directions of the electron beams emitted by the photocathode by simultaneously directing the radiation in multiple directions; and
   c) directing said plurality of electron beams onto an acceptance region of an electron beam optical column, producing thereby a plurality of electron beams impacting a target located at the target end of said electron beam optical column.

20. A method as in claim 19 wherein said radiation is uv radiation.

21. A method as in claim 20 wherein said radiation is generated by a mercury arc lamp.

22. A method as in claim 21 wherein said photocathode is cesium telluride.

23. A method as in claim 19 wherein said spatial light modulator is a micromirror array.

24. A method as in claim 19 wherein said spatial light modulator is configured to simultaneously modulate the radiation in a direction corresponding to each electron beam produced by the photocathode.

* * * * *